United States Patent
An et al.

(10) Patent No.: US 12,538,736 B2
(45) Date of Patent: Jan. 27, 2026

(54) ELECTRODE STRUCTURE OF ROLLER UNIT FOR TRANSFERRING SEMICONDUCTOR LIGHT-EMITTING ELEMENT AND INTELLIGENT INTEGRATED ASSEMBLING AND TRANSFERRING DEVICE COMPRISING SAME

(71) Applicant: LG ELECTRONICS INC., Seoul (KR)

(72) Inventors: Kitae An, Seoul (KR); Bongchu Shim, Seoul (KR); Jinhyung Jun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 301 days.

(21) Appl. No.: 18/275,548

(22) PCT Filed: Feb. 3, 2021

(86) PCT No.: PCT/KR2021/001407
§ 371 (c)(1),
(2) Date: Aug. 2, 2023

(87) PCT Pub. No.: WO2022/168998
PCT Pub. Date: Aug. 11, 2022

(65) Prior Publication Data
US 2024/0120218 A1 Apr. 11, 2024

(51) Int. Cl.
*H01L 21/67* (2006.01)
*B32B 37/04* (2006.01)
(Continued)

(52) U.S. Cl.
CPC ........ *H01L 21/67144* (2013.01); *B32B 37/04* (2013.01); *B32B 37/1027* (2013.01);
(Continued)

(58) Field of Classification Search
CPC ......... H01L 21/67144; H01L 21/67259; H01L 21/6833; H01L 2224/95101;
(Continued)

(56) References Cited

U.S. PATENT DOCUMENTS 6,796,867 B2 * 9/2004 George ................ G02B 6/0033
445/24
8,312,619 B2 11/2012 Chow et al.
(Continued)

FOREIGN PATENT DOCUMENTS

JP 2008-516415 A 5/2008
KR 10-2037226 B1 10/2019
(Continued)

*Primary Examiner* — Philip C Tucker
*Assistant Examiner* — Jimmy R Smith, Jr.
(74) *Attorney, Agent, or Firm* — Birch, Stewart, Kolasch & Birch, LLP

(57) ABSTRACT

Embodiments relate to an electrode structure of a transfer roller part of a semiconductor light emitting device and an intelligent assembly-transfer integration device including the same. Electrode structure of transfer roller part of semiconductor light emitting device according to an embodiment can include a roller rotating part, an assembly substrate mounted on the roller rotating part, an adhesive film disposed between the roller rotating part and the assembly substrate, penetration electrodes penetrating the assembly substrate and roller pad electrodes disposed on the roller rotating part and electrically connected to the penetration electrodes.

9 Claims, 14 Drawing Sheets

(51) Int. Cl.
*B32B 37/10* (2006.01)
*H01L 21/683* (2006.01)
*H01L 25/075* (2006.01)

(52) U.S. Cl.
CPC .... *H01L 21/67259* (2013.01); *H01L 21/6833* (2013.01); *H01L 25/0753* (2013.01)

(58) Field of Classification Search
CPC ... H01L 25/0753; H10H 20/01; B32B 37/025; B32B 37/1027; B32B 37/1036
USPC ..................................................... 156/380.2
See application file for complete search history.

(56) References Cited

U.S. PATENT DOCUMENTS

| | | |
|---|---|---|
| 9,418,979 B2 | 8/2016 | Karlicek, Jr. et al. |
| 9,825,202 B2 | 11/2017 | Schuele et al. |
| 2006/0057293 A1 | 3/2006 | Sharma et al. |
| 2013/0161584 A1 | 6/2013 | Crowder et al. |
| 2017/0133550 A1* | 5/2017 | Schuele ............... H10H 20/824 |
| 2019/0326144 A1 | 10/2019 | Shim et al. |
| 2021/0358893 A1 | 11/2021 | Shim et al. |

FOREIGN PATENT DOCUMENTS

| | | |
|---|---|---|
| KR | 10-2020-0103973 A | 9/2020 |
| KR | 10-2162739 B1 | 10/2020 |
| KR | 10-2021-0140956 A | 11/2021 |

* cited by examiner

[FIG. 1]
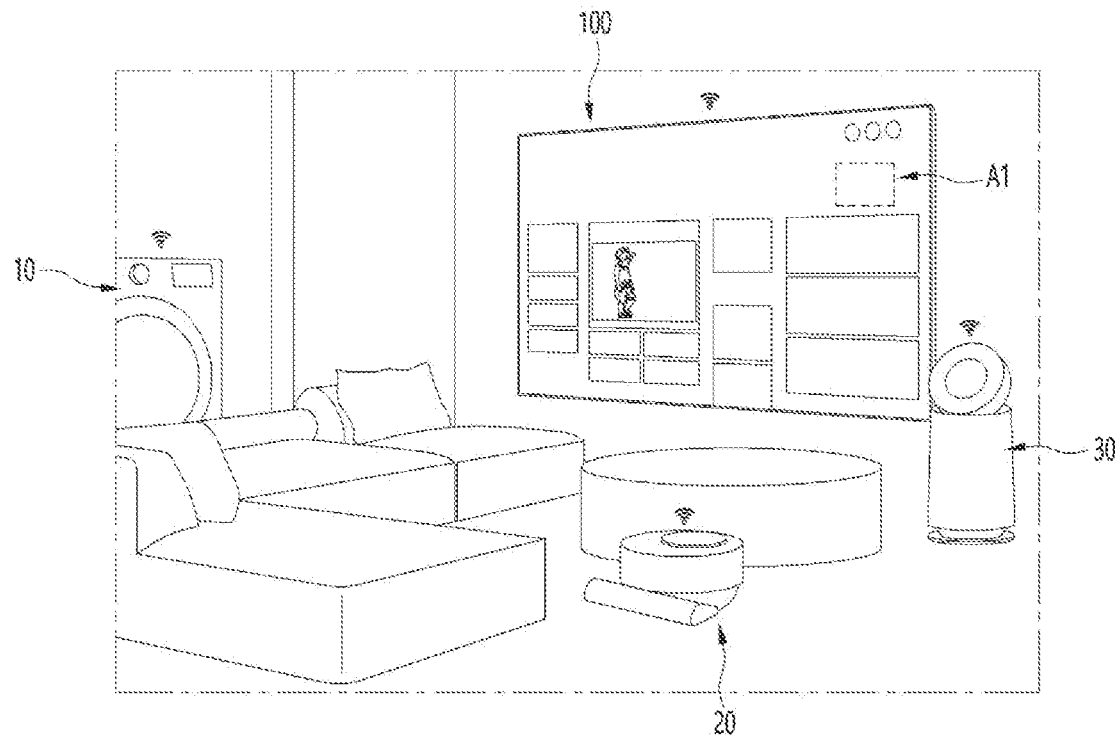
[FIG. 2A]
A1
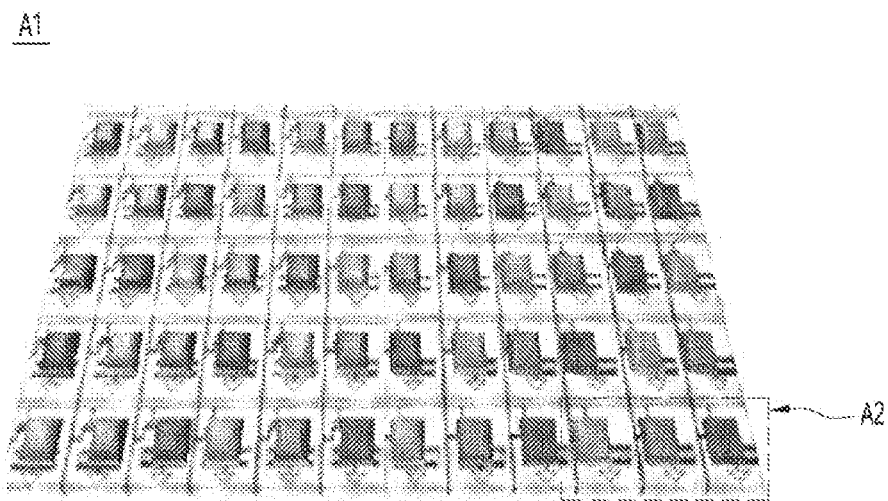

[FIG. 2B]
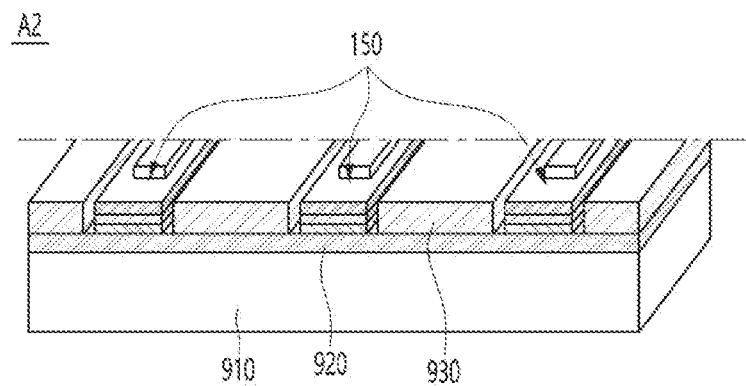
[FIG. 2C]
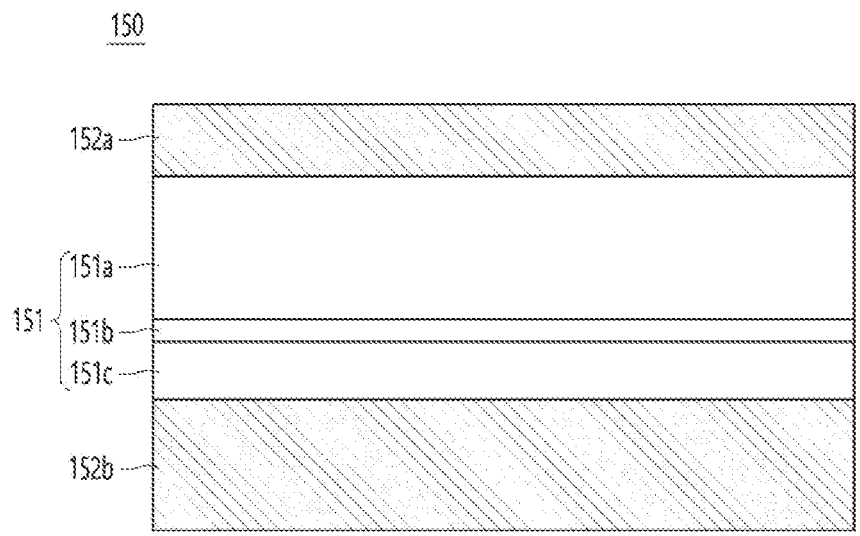

[FIG. 3]
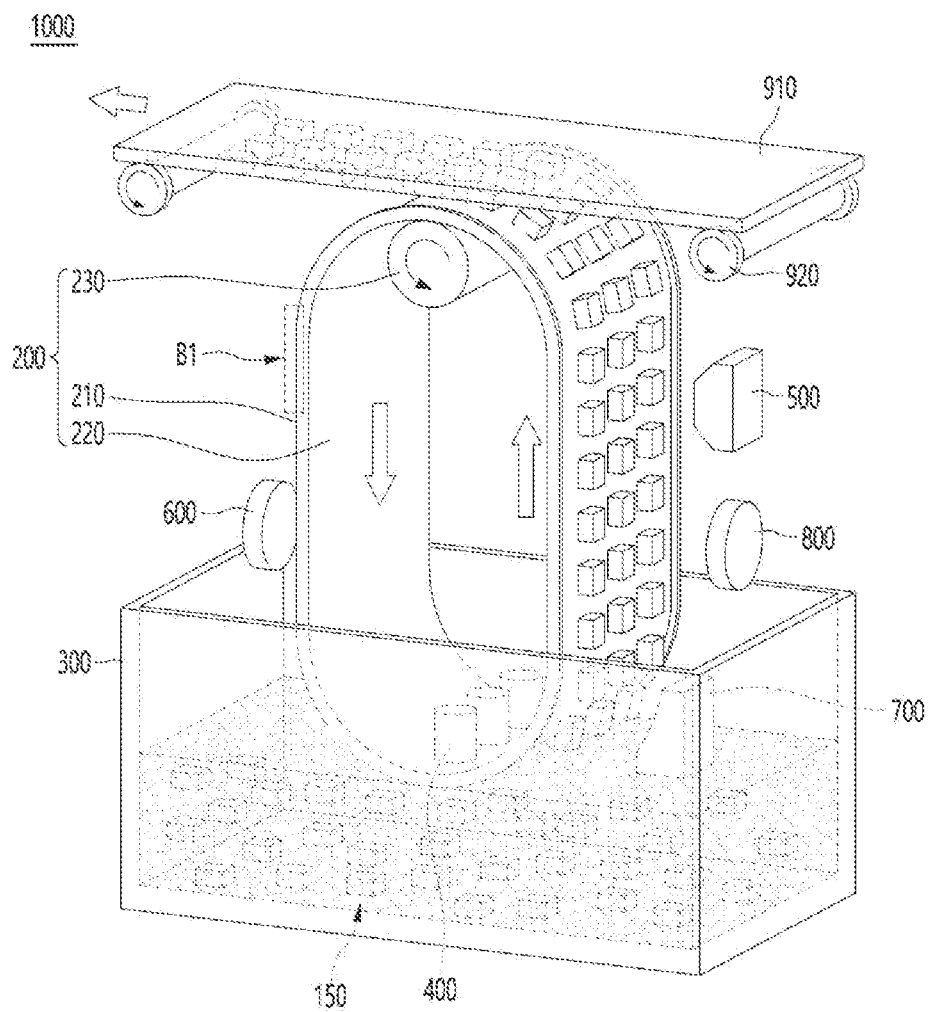

[FIG. 4]
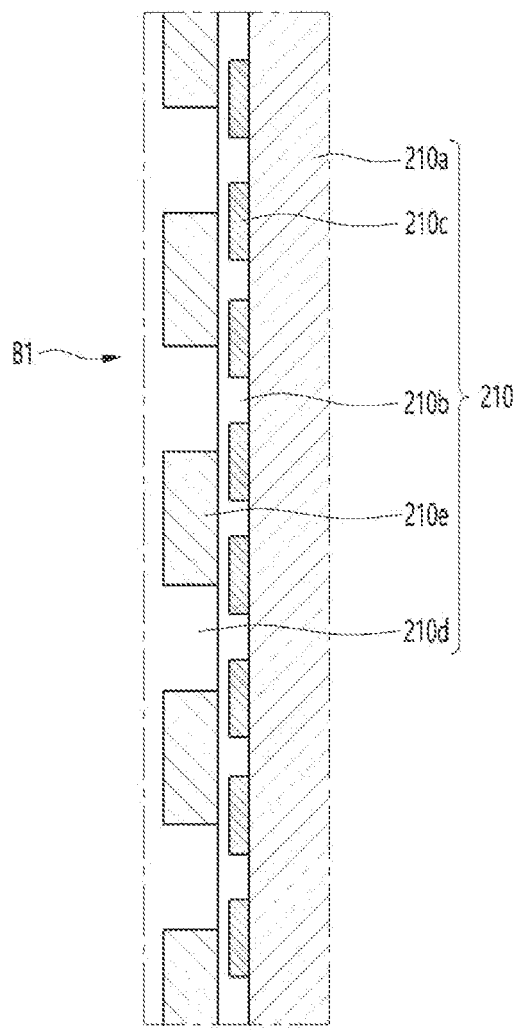

[FIG. 5A]
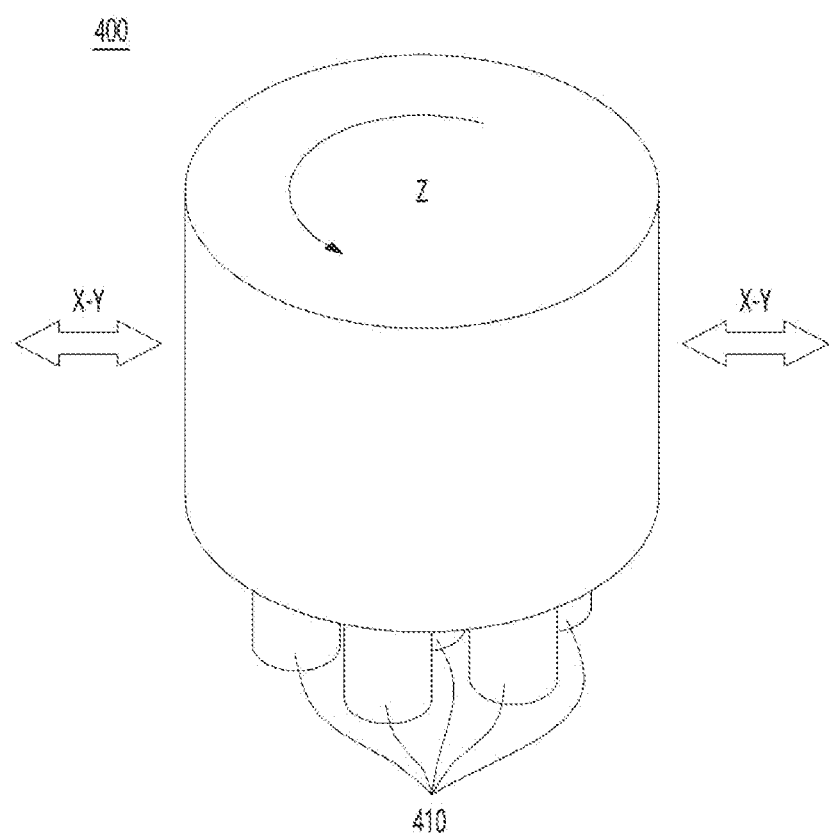

[FIG. 5B]
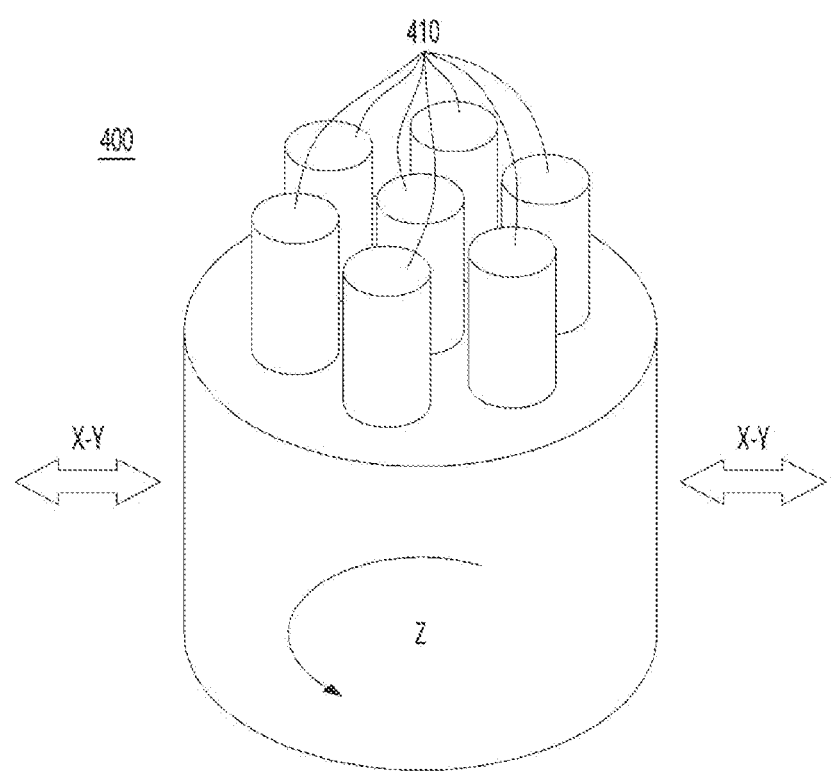

[FIG. 6]
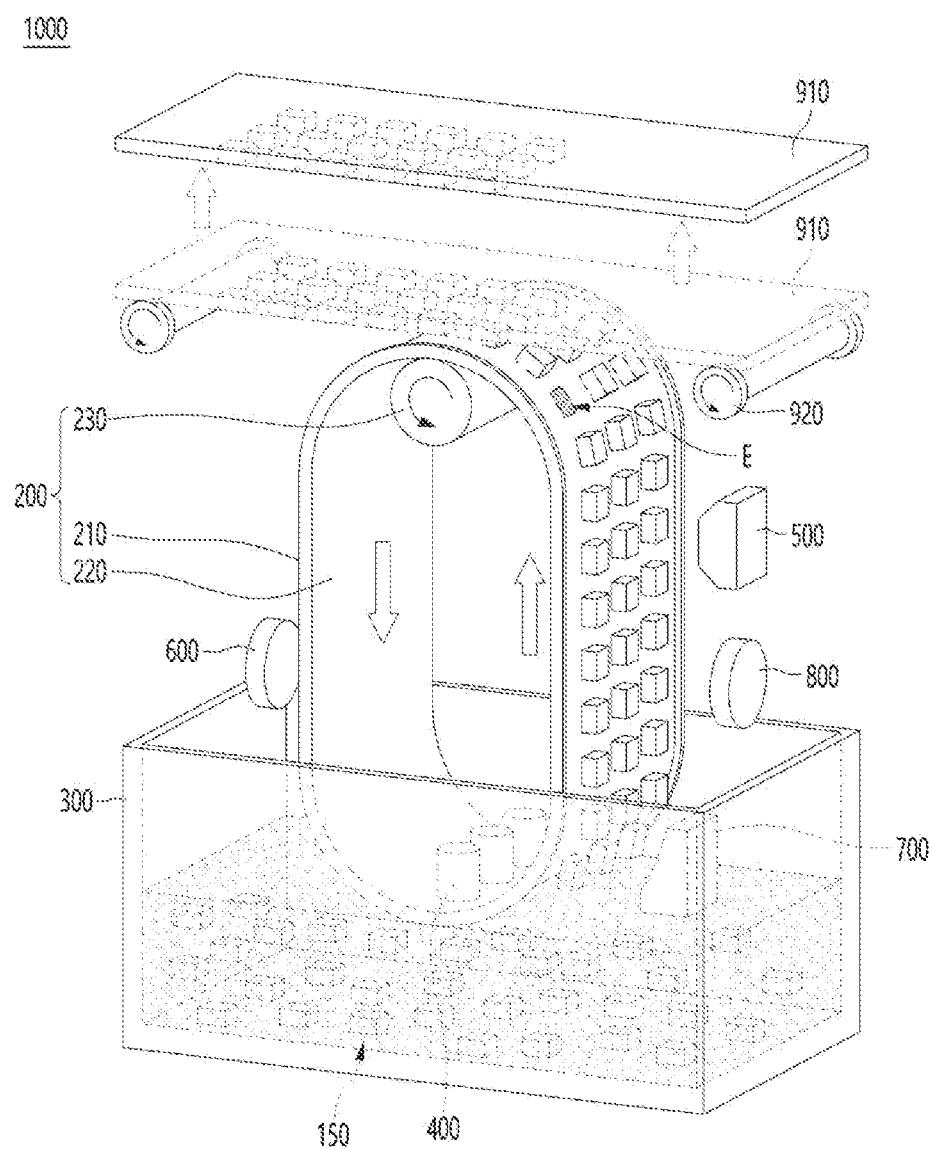

[FIG. 7]
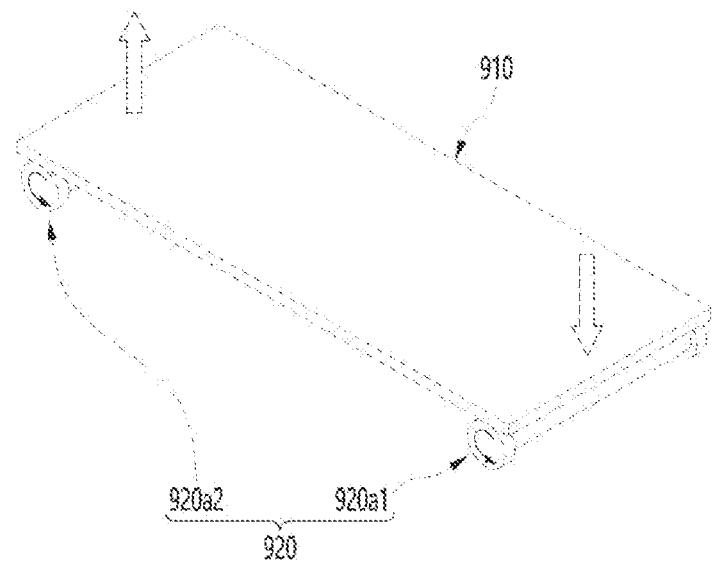
(A)
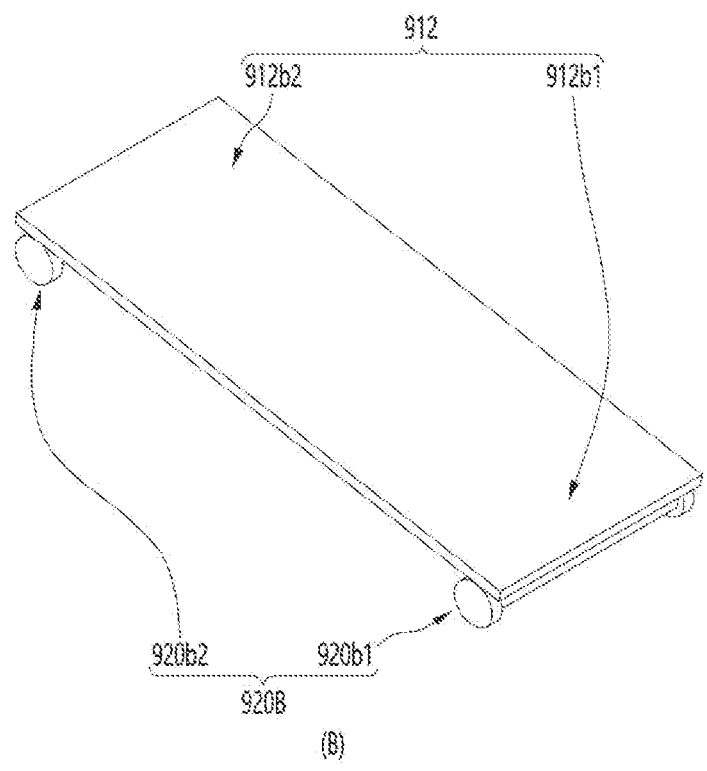
(B)

[FIG. 8]
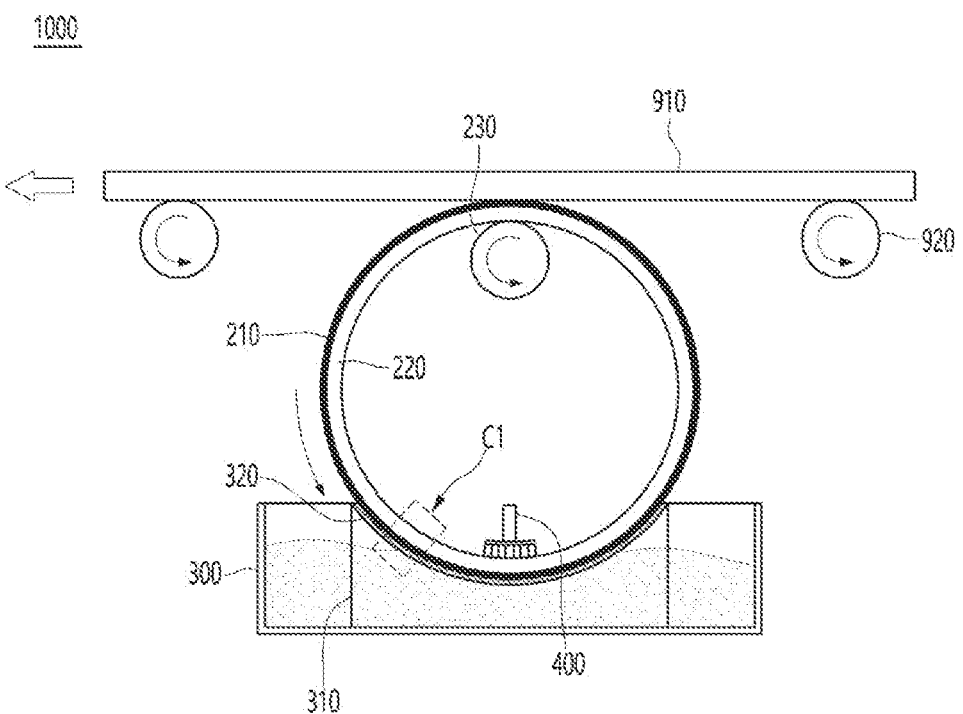

[FIG. 9]
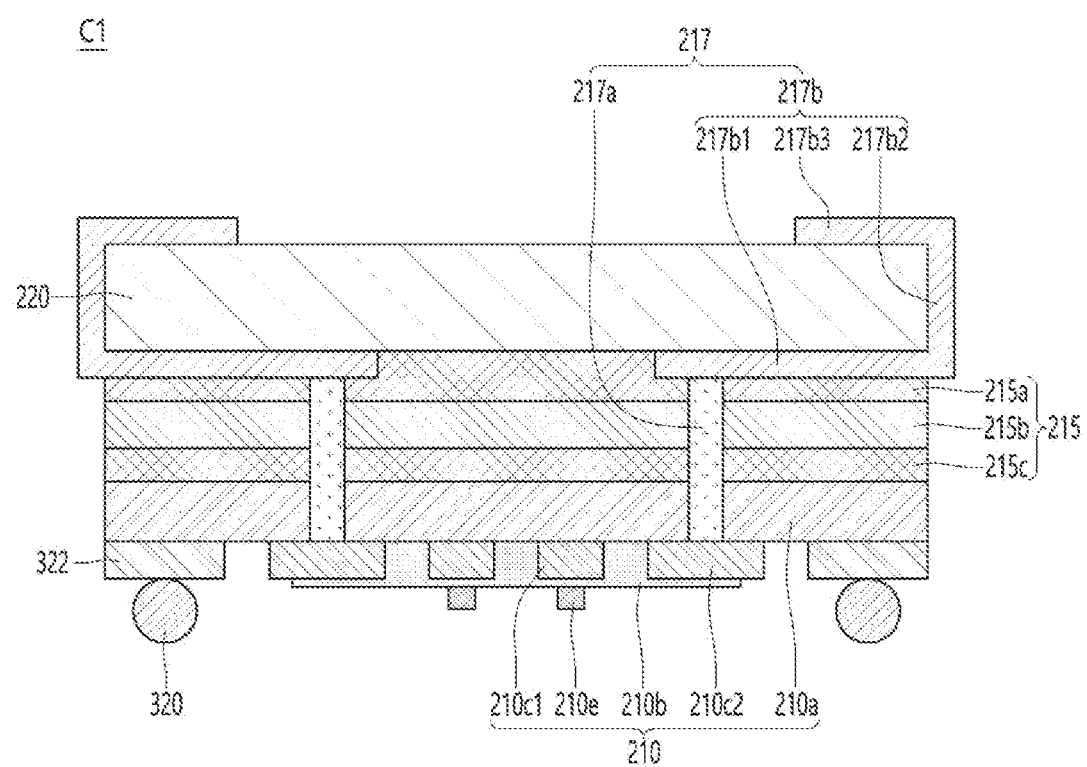

[FIG. 10]
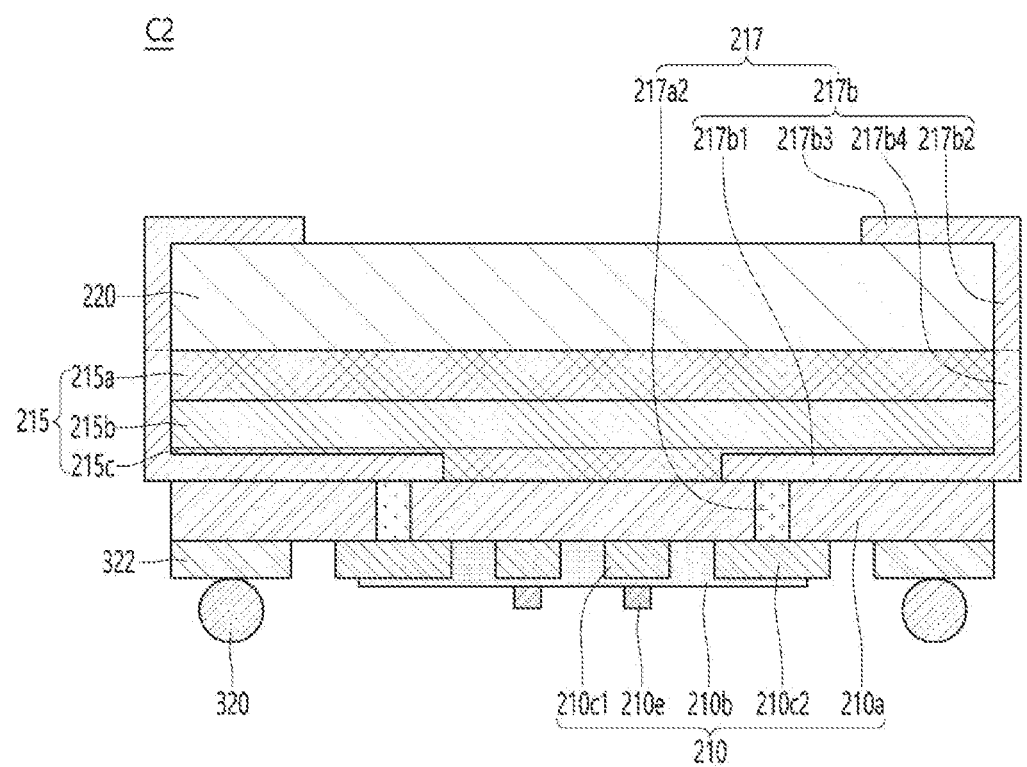

[FIG. 11]
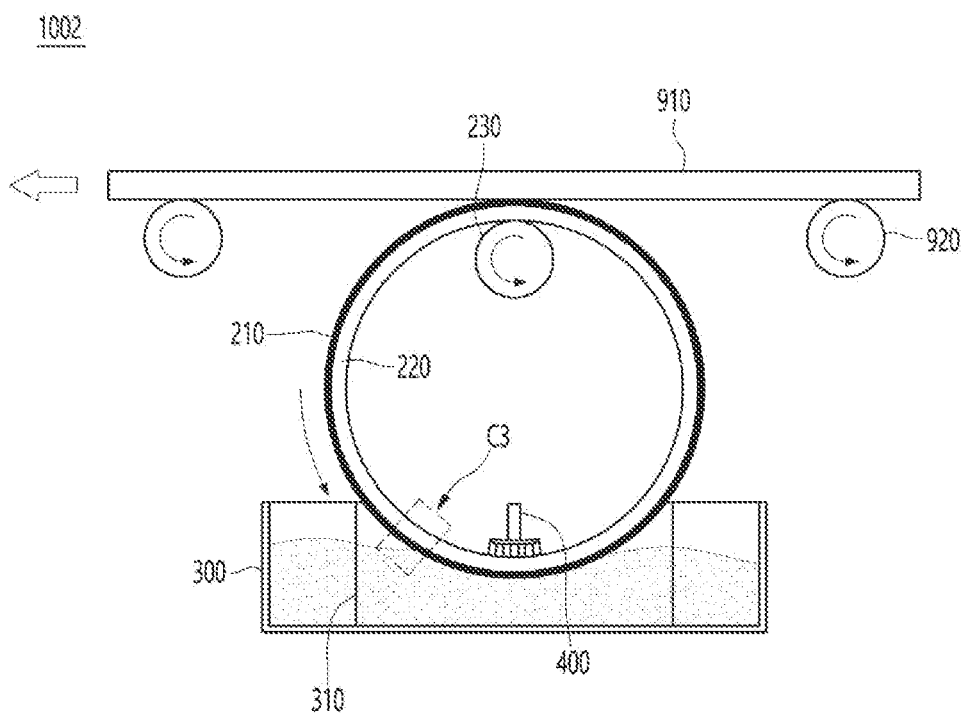

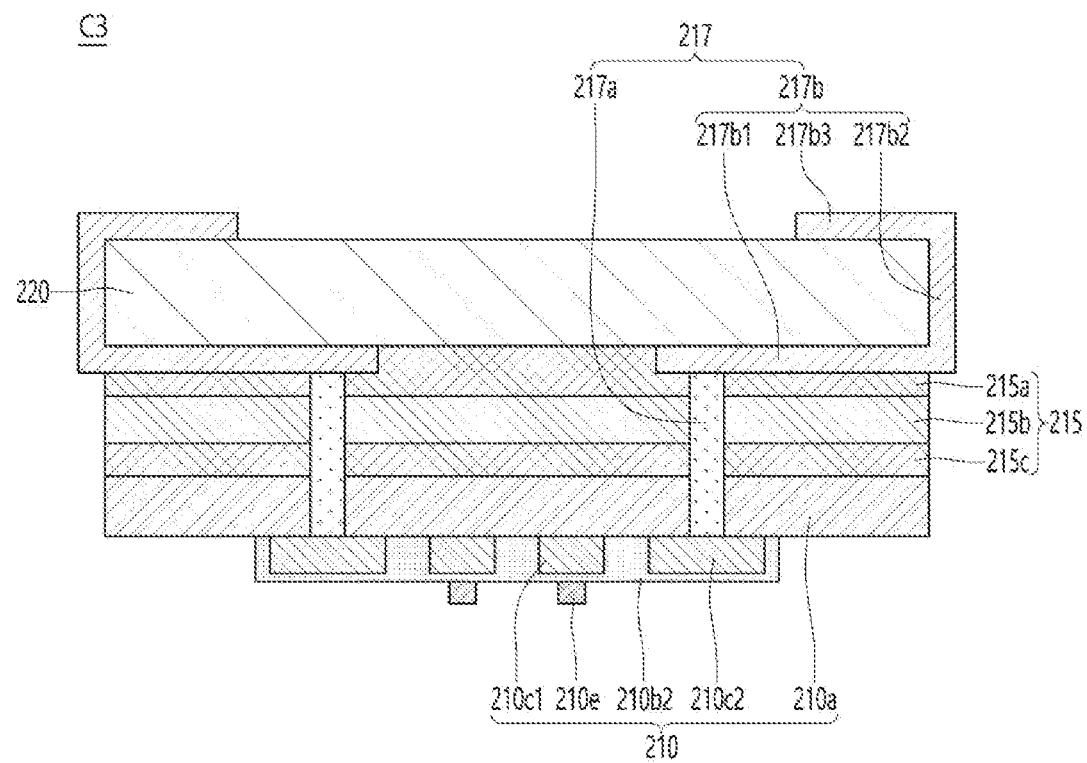
[FIG. 12]

[FIG. 13]
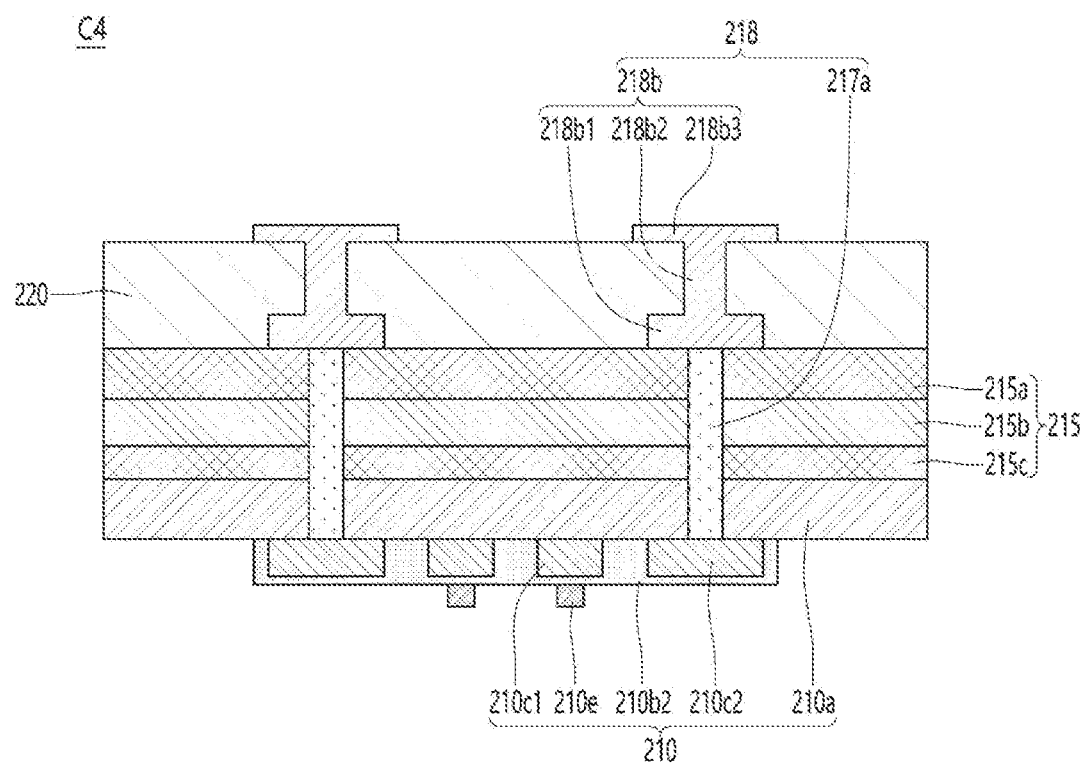

ELECTRODE STRUCTURE OF ROLLER UNIT FOR TRANSFERRING SEMICONDUCTOR LIGHT-EMITTING ELEMENT AND INTELLIGENT INTEGRATED ASSEMBLING AND TRANSFERRING DEVICE COMPRISING SAME

CROSS REFERENCE TO RELATED APPLICATIONS

This application is the National Phase of PCT International Application No. PCT/KR2021/001407, filed on Feb. 3, 2021, all of which is hereby expressly incorporated by reference into the present application.

TECHNICAL FIELD

An embodiment relates to an integration device for assembly-transfer a semiconductor light emitting device. Specifically, the embodiment relates to an electrode structure of a transfer roller part of a semiconductor light emitting device and an intelligent assembly-transfer integration device including the same.

BACKGROUND ART

Large-area display technology includes a liquid crystal display (LCD), an OLED display, or a micro-LED display. A micro-LED display is a display using a micro-LED, which is a semiconductor light emitting device having a diameter or cross-sectional area of 100 µm or less, as a display device.

Micro-LED display has excellent performance in terms of contrast ratio, response speed, color reproducibility, viewing angle, brightness, resolution, lifespan, luminous efficiency, and luminance because it uses micro-LED as a display element.

In particular, the micro-LED display has the advantage of being free to adjust the size or resolution because the screen can be separated and combined in a modular manner, and has the advantage of being able to implement a flexible display.

However, since the micro-LED display requires more than millions of semiconductor light emitting devices, there is a technical problem in that it is difficult to quickly and accurately transfer the semiconductor light emitting devices to the display panel.

In the recently developed transcription technology, there are pick and place process, a laser lift-off method, or a self-assembly method, etc.

Among these, the self-assembly method is a technology in which a semiconductor light emitting device finds an assembly position by itself in a fluid, and is advantageous for implementing a large-screen display device.

Recently, although a micro-LED structure suitable for self-assembly has been proposed in U.S. Pat. No. 9,825,202, research on a technology for manufacturing a display by self-assembly of micro-LEDs is still insufficient.

In particular, in the case of quickly transferring millions or more semiconductor light emitting devices to a large display in the related art, although the transfer speed can be improved, there is a problem in that the transfer error rate can be increased and the transfer yield is lowered. On the other hand, when trying to increase the transfer yield by lowering the transfer defect rate, the transfer speed is reduced.

What is described in this section is not related art, and is only for the purpose of understanding the invention according to the embodiment.

DISCLOSURE

Technical Problem

One of the technical objects of the embodiment is to provide an intelligent assembly-transfer integration device capable of simultaneously improving transfer speed and transfer yield in transferring semiconductor light emitting devices to a display panel.

Meanwhile, as an undisclosed internal technology, an intelligent assembly-transfer integration device is being researched and developed. In the undisclosed internal technology, the assembly substrate mounted on the rotating part of the roller for self-assembly comes into contact with the O-ring of the bath, resulting in damage to the electrodes on the assembly substrate due to mutual frictional force.

Accordingly, one of the technical objects of the embodiment is to provide an electrode structure of a transfer roller part of a semiconductor light emitting device capable of preventing damage to electrodes of an assembly substrate and an intelligent assembly-transfer integration device including the same.

The technical objects of the embodiment are not limited to those described in this section, and include those that can be understood through the description of the invention.

Technical Solution

Electrode structure of the transfer roller part of the semiconductor light emitting device according to the embodiment can include a roller rotating part, an assembly substrate mounted on the roller rotating part, an adhesive film disposed between the roller rotating part and the assembly substrate, penetration electrodes penetrating the assembly substrate and roller pad electrodes disposed on the roller rotating part and electrically connected to the penetration electrodes.

The assembly substrate can include a base, a plurality of assembly electrodes and assembly pad electrodes disposed on the base, and a dielectric layer on the base.

The penetration electrode can be electrically connected to the assembly pad electrode by penetrating the base portion and the adhesive film.

The roller pad electrode can include a first pad electrode disposed on a first surface of the roller rotating part, a second pad electrode disposed on a side surface of the roller rotating part, and a third pad electrode disposed on the second surface of the roller rotating part.

The roller pad electrode can include a first pad electrode disposed on a first surface of the adhesive film and a second pad electrode disposed on a side surface of the roller rotating part; a fourth pad electrode and a third pad electrode disposed on the second surface of the roller rotating part.

The penetration electrode can be electrically connected to the assembly pad electrode through the base portion.

The assembly substrate includes a base, a plurality of assembly electrodes and assembly pad electrodes disposed on the base, and a dielectric layer on the base. The dielectric layer can be disposed to cover the plurality of assembly electrodes.

The dielectric layer can be disposed to cover the plurality of assembly electrodes and the assembly pad electrode.

The roller pad electrode can include a second-first pad electrode disposed on a first surface of the roller rotating part, a second-third pad electrode disposed on a second surface of the roller rotating part, and a second-second pad electrode disposed between the second-first pad electrode and the second-third pad electrode.

The second-second pad electrode can pass through the roller rotating part.

Intelligent assembly-transfer integration device according to the embodiment can include a roller part on which a fluid chamber accommodating semiconductor light emitting devices, an assembly substrate on which the semiconductor light emitting devices are assembled are mounted and rotated, and an assembly inspection part inspecting the semiconductor light emitting device assembled on the assembly substrate. The roller part can include an electrode structure of a transfer roller part of any one of the semiconductor light emitting devices.

Intelligent assembly-transfer integration device according to the embodiment can include a fluid chamber 300 accommodating the semiconductor light emitting devices 150, a roller part 200 on which the assembly substrate 210 on which the semiconductor light emitting devices 150 are assembled is mounted and rotated, and assembly inspection part 500 for inspecting the semiconductor light emitting device 150 assembled on the assembly substrate 210.

The roller part 200 can include a roller rotating part 220 on which the assembly substrate 210 is mounted and rotated, a roller driving part 230 for rotating and driving the roller rotating part 220, and a magnet head part 400 applying magnetic force to the semiconductor light emitting device 150 to be assembled to the assembly substrate 210.

The assembly inspection part inspects the assembly state of each line in the width direction of the assembly substrate 210 and can control the transfer process not to proceed to the panel substrate 910 when there is an unassembled or defective assembly.

If there is an error position (E) of non-assembly or defective assembly by inspecting the assembly state of each line in the width direction of the assembly substrate 210, when a predetermined panel chuck moves the panel substrate 910 to separate the assembly substrate 210 from the panel substrate 910, it is possible to control so that the semiconductor light emitting device 150 in the error position is not transferred to the panel substrate 910.

The panel chuck can be disposed on a side surface, top surface, or bottom surface of the panel substrate 910 to separate the panel substrate 910 from the assembly substrate 210.

The magnet head 400 can evenly apply magnetic force to the semiconductor light emitting device 150 by rotating or horizontally moving.

The panel chuck can have a rotation function of the panel substrate 910 such that the second panel substrate 912 is moved in an inclined state.

A panel driver for driving the panel substrate 910 to move can be further included.

The panel driver 920B includes a second-first panel driver 920*b*1 and a second-second panel driver 920*b*2, but the second-first panel driver 920*b*1 can be disposed at a different height from the second-second panel driver 920*b*2.

The roller part can have a triangular shape or a round shape.

Area of the first-first roller part assembled between the semiconductor light emitting device 150 and the assembly substrate 210 can be larger than an area of the first-second roller part where the semiconductor light emitting device 150 is transferred to the panel substrate 910.

A second magnet head 420 disposed below the fluid chamber 300 can be further included.

Effects of the Invention

According to the intelligent assembly-transfer integrating device of the semiconductor light emitting device according to the embodiment, there is a technical effect of simultaneously improving the transfer speed and the transfer yield in transferring the semiconductor light emitting devices to the display panel.

For example, according to the embodiment, as the semiconductor light emitting device 150 is assembled to a transfer substrate 210, and the assembled semiconductor light emitting devices 150 are immediately transferred to the panel substrate 110 in line, the transfer speed can be significantly improved. In addition, according to the embodiment, only when the semiconductor light emitting devices 150 assembled on the transfer substrate 210 are inspected in real time and are normal, by selectively transferring the semiconductor light emitting devices 150 to the panel substrate 910, the transfer yield can be remarkably increased. Accordingly, according to the embodiment, by simultaneously increasing the transfer speed and the transfer yield, there is a special technical effect that can solve the problem of technical contradiction between the transfer speed and the transfer yield.

Specifically, according to the embodiment, a line transfer can be performed in the width direction of the roller part 200 at a portion where the assembly substrate 210 on the roller part 200 and the flat panel substrate 910 meet. In addition, according to the embodiment, since only the semiconductor light emitting devices on the completely assembled line without defects selected through assembly inspection are transferred, 100% transfer yield can be implemented.

Accordingly, according to the embodiment, even if there is a defect in the assembly substrate or the defect in the semiconductor light emitting device, it is possible to avoid of transferring the defect, thereby minimizing the dependence on the quality of the semiconductor light emitting device.

In addition, according to the embodiment, since the assembly process and the transfer process are separated but connected in-line, there is an effect of not limiting the transfer area according to the size of the assembly system.

In addition, according to the embodiment, since a separate space for assembly is not required at the edge portion of the panel substrate, a high chamfering rate can be secured when chamfering to a small area after a large area process.

In addition, according to the embodiment, if the roller part is configured in multiples, there is an effect of enabling high-speed transfer.

In addition, according to the electrode structure of the transfer roller part of the semiconductor light emitting device according to the embodiment and the intelligent assembly-transfer integration device including the same, there is a technical effect of preventing damage to the electrodes of the assembly substrate.

For example, according to the embodiment, there is a technical effect of preventing electrode damage due to friction due to the rear electrode structure in which the electrode part directly in contact with the O-ring moves to the rear surface during self-assembly.

In addition, according to the embodiment, it is not necessary to use the O-ring itself when applying the rear electrode, and the overall size of the water tank and the rotating part can be reduced, so the embodiment has an effect of increasing the degree of spatial freedom.

In addition, according to the embodiment, since the second roller pad electrode is not disposed on the side surface of the roller rotating part, the possibility of receiving electrical damage from the fluid is prevented, electrical reliability is remarkably improved, and the overall size of the water tank and the rotating part can be reduced, thereby increasing the degree of freedom of space.

The technical effects of the embodiments are not limited to those described in this section, but include those that can be understood through the description of the invention.

DESCRIPTION OF DRAWINGS

FIG. 1 is an exemplary view in which a display device 100 according to an embodiment is disposed in a living room together with a washing machine 10, a robot cleaner 20, an air purifier 30, and the like.

FIG. 2A is an enlarged view of area A1 in FIG. 1.

FIG. 2B is an enlarged view of region A2 in FIG. 2A.

FIG. 2C is a cross-sectional view of the semiconductor light emitting device 150 in FIG. 2B.

FIG. 3 is a conceptual diagram of an intelligent assembly-transfer integration device 1000 according to an embodiment.

FIG. 4 is an enlarged view of an area B1 of an assembly substrate 210 in the intelligent assembly-transfer integration device 1000 according to the embodiment shown in FIG. 3.

FIGS. 5A and 5B are perspective views of the magnet head part 400 in the intelligent assembly-transfer integration device 1000 according to the embodiment shown in FIG. 3.

FIG. 6 is an example of the operation of the intelligent assembly-transfer integration device 1000 according to the embodiment.

FIG. 7 is a conceptual view of tilting the panel substrate 110 in the embodiment.

FIG. 8 is a conceptual diagram of an intelligent assembly-transfer integration device 1000 according to an embodiment.

FIG. 9 is an enlarged view of the first roller part electrode structure C1 in the intelligent assembly-transfer integration device 1000 according to the embodiment shown in FIG. 8.

FIG. 10 is an enlarged view of the second roller part electrode structure C2 in the intelligent assembly-transfer integration device 1000 according to the embodiment shown in FIG. 8.

FIG. 11 is a conceptual diagram of an intelligent assembly-transfer integration device 1002 according to a second embodiment.

FIG. 12 is an enlarged view of the electrode structure C3 of the third roller part in the intelligent assembly-transfer integration device 1002 according to the second embodiment shown in FIG. 11.

FIG. 13 is an enlarged view of the fourth roller part electrode structure C4 in the intelligent assembly-transfer integration device 1002 according to the second embodiment shown in FIG. 11.

MODE FOR INVENTION

Hereinafter, the embodiments described in this specification will be described in detail with reference to the accompanying drawings, and the technical idea disclosed in this specification is not limited by the accompanying drawings. In addition, when a component is referred to as being disposed 'on' another component, it can be directly disposed on the other component or another component can be further disposed between them.

The display devices described in this specification include digital TVs, mobile phones, smart phones, laptop computers, digital broadcasting terminals, personal digital assistants (PDAs), a portable multimedia player (PMP), a navigation device, a slate PC, a tablet PC, an ultra-book, a desktop computer, and the like. In addition, the embodiments described in this specification can be applied to a device capable of displaying a new product type to be developed in the future.

Prior to describing an intelligent assembly-transfer integration device of a semiconductor light emitting device according to an embodiment, a semiconductor light emitting device applied in the embodiment and a display device using the same will be described.

FIG. 1 is an exemplary view in which a display device 100 according to an embodiment is disposed in a living room together with a washing machine 10, a robot cleaner 20, and an air purifier 30.

The display device 100 of the embodiment can display the status of various electronic products such as the air purifier 30, the robot cleaner 20, and the washing machine 10, and can communicate with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for implementing one color. A unit pixel of the flexible display can be implemented by a semiconductor light emitting device. In an embodiment, the semiconductor light emitting device can be a Micro-LED.

Next, FIG. 2A is an enlarged view of area A1 in FIG. 1, FIG. 2B is an enlarged view of area A2 in FIG. 2A, and FIG. 2C is a cross-sectional view of the semiconductor light emitting device 150 in FIG. 2B.

As shown in FIG. 2A, the display device 100 of the embodiment can drive a semiconductor light emitting device by an active matrix (AM) method, but is not limited thereto, and the semiconductor light emitting device can be driven in a passive matrix (PM) method.

Next, referring to FIG. 2B, the display device 100 of the embodiment can include a panel substrate 910, a first panel electrode 920, a second panel electrode (not shown), an insulating layer 930, and a plurality of semiconductor light emitting devices 150.

Each semiconductor light emitting device 150 can include red, green, and blue semiconductor light emitting devices to form a sub-pixel, but is not limited thereto, and can implement red and green colors by including a red phosphor and a green phosphor, respectively.

The panel substrate 910 can be formed of glass or polyimide. In addition, the panel substrate 910 can include a flexible material such as polyethylene naphthalate (PEN) or polyethylene terephthalate (PET). In addition, the panel substrate 910 can be a transparent material, but is not limited thereto.

The insulating layer 930 can include an insulating and flexible material such as polyimide, PEN, or PET, and can be formed integrally with the panel substrate 910 to form a single substrate.

The insulating layer 930 can be a conductive adhesive layer having adhesiveness and conductivity, and the conductive adhesive layer can have ductility to enable a flexible function of the display device. For example, the insulating layer 930 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

Next, FIG. 2C is a cross-sectional view of a vertical type semiconductor light emitting device as an example of the semiconductor light emitting device 150 applied to the display device 100 of the embodiment. A semiconductor light emitting device that can be employed in the embodiment is not limited to a vertical type semiconductor light emitting device, and can include a lateral type semiconductor light emitting device or a flip type light emitting device.

The semiconductor light emitting device used in the embodiment is a p-n junction diode in which electrical energy is converted into light energy, and can be made of a compound semiconductor containing elements of groups III and V on the periodic table, and can implement various colors such as red, green, and blue by controlling the band gap energy by adjusting the composition ratio of the compound semiconductor.

Referring to FIG. 2C, the semiconductor light emitting device 150 of the embodiment can include a light emitting structure 151, a first electrode 152a, and a second electrode 152b. The light emitting structure 151 can include a first conductivity type semiconductor layer 151a, an active layer 151b, and a second conductivity type semiconductor layer 151c. A pad electrode (not shown) can be further formed on the first electrode 152a or the second electrode 152b, but is not limited thereto.

At least one of the first electrode 152a or the second electrode 152b can include a magnetic layer (not shown). The first conductivity type can be n-type, and the second conductivity type can be p-type, but is not limited thereto. The magnetic layer can include at least one of Ni, samarium-cobalt (SmCo), Gd-based, La-based, and Mn-based materials. The magnetic layer can be disposed in a mesh shape or a dot shape to have excellent light transmittance.

One of the technical objects of the embodiment is to provide an intelligent assembly-transfer integration device for semiconductor light emitting devices capable of simultaneously improving transfer speed and transfer yield when transferring semiconductor light emitting devices to a display panel.

FIG. 3 is a conceptual diagram of an intelligent assembly-transfer integration device 1000 according to an embodiment. FIG. 4 is an enlarged view of the B1 area of the assembly substrate 210 in the intelligent assembly-transfer integration device 1000 according to the embodiment shown in FIG. 3. FIGS. 5A and 5B are perspective views of the magnet head 400 in the intelligent assembly-transfer integration device 1000 according to the embodiment shown in FIG. 3. FIG. 6 is an exemplary operation view of the intelligent assembly-transfer integration device 1000 according to the embodiment.

In addition, the intelligent assembly-transfer integration device 1000 according to the embodiment can include a hydrophilic treatment unit 600, a washing unit 700, a drying unit 800, and the like.

In addition, the intelligent assembly-transfer integration device 1000 according to the embodiment can include a panel driver 920 that horizontally moves the display panel substrate 910 and a panel chuck that vertically moves the panel substrate 910 (not shown).

For example, according to the embodiment, as the semiconductor light emitting device 150 can be assembled to a transfer substrate 210, and the assembled semiconductor light emitting devices 150 can be immediately transferred to the panel substrate 110 in line, the transfer speed can be significantly improved. In addition, according to the embodiment, only when the semiconductor light emitting devices 150 assembled on the transfer substrate 210 are inspected in real time and are normal, by selectively transferring the semiconductor light emitting devices 150 to the panel substrate 910, the transfer yield can be remarkably increased. Accordingly, according to the embodiment, by simultaneously increasing the transfer speed and the transfer yield, there is a special technical effect that can solve the problem of technical contradiction between the transfer speed and the transfer yield.

Hereinafter, the intelligent assembly-transfer integration device 1000 according to the embodiment will be described in detail with reference to FIGS. 3 to 6.

<Fluid Chamber, Hydrophilic Treatment Unit>

Referring to FIG. 3, the intelligent assembly-transfer integration device 1000 according to the embodiment can include a fluid chamber 300 accommodating a plurality of semiconductor light emitting devices 150, a hydrophilic processing unit 600, and the like.

The fluid chamber 300 can be a water tank, and can be of an open type or a closed type. The fluid chamber 300 can be filled with an assembly solution such as deionized water, but is not limited thereto.

The hydrophilic treatment unit 600 can perform a hydrophilic treatment for wetting before the assembly substrate 210 is submerged in a fluid.

<Assembly Substrate>

The embodiment can include a flexible assembly substrate 210 mounted on the roller part 200. The assembly substrate 210 can be referred to as a carrier substrate or a first transfer substrate.

For example, the assembly substrate 210 can be a flexible substrate that can be mounted on the roller rotating part 220. For example, the assembly substrate 210 can be a flexible material that can be rolled like a roll, or can be a polymer such as polyimide or a thin metal substrate, but is not limited thereto.

FIG. 4 is an enlarged view of the area B1 of the assembly substrate 210 in the intelligent assembly-transfer integration device 1000 according to the embodiment shown in FIG. 3.

The assembly substrate 210 can include a base portion 210a, a dielectric layer 210b, and a plurality of assembly electrodes 210c to form an electric field.

The base portion 210a is made of an insulating material, and the plurality of assembly electrodes 210c can be thin film or thick film bi-planar electrodes patterned on one surface of the base portion 210a. The assembly electrode 210c can be formed of a Ti/Cu/Ti stack, Ag paste, ITO, or the like.

The dielectric layer 210b is made of an inorganic material such as $SiO_2$, $SiNx$, $SiON$, $Al_2O_3$, $TiO_2$, or $HfO_2$. In addition, the dielectric layer 210b is an organic insulator and can be formed as a single layer or a multi-layer structure.

In addition, the assembly substrate 210 can include a plurality of cells 210d partitioned by barrier walls 210e. The cells 210d can be sequentially arranged along one direction. In addition, the barrier wall 210e constituting the cells 210d can be shared with neighboring cells 210d.

The barrier wall 210e can protrude upward from the base portion 210a, and the cells 210d can be sequentially disposed along one direction by the barrier wall 210e. For example, the cells 210d can be sequentially arranged in column and row directions, respectively, and can have a matrix structure.

The inside of the cells 210d can be an assembly groove accommodating the semiconductor light emitting device 150, and the assembly groove can be a space partitioned by the barrier wall 210e.

The shape of the assembly groove can be the same as or similar to the outer shape of the semiconductor light emitting device 150. For example, when the semiconductor light emitting device 150 has a rectangular shape, the assembly groove can have a rectangular shape. In addition, when the semiconductor light emitting device 150 has a circular shape, the assembly groove can have a circular shape. In addition, one semiconductor light emitting device 150 can be accommodated in each cell.

Meanwhile, the plurality of assembly electrodes 210c can include a plurality of electrode lines disposed on the bottom of each of the cells 210d, and the plurality of electrode lines can extend to adjacent cells.

The plurality of assembly electrodes 210c are disposed below the cells 210d, and different polarities can be applied thereto to generate an electric field in the cells 210d. To form the electric field, the dielectric layer 210b can form the bottom of the cells 210d while covering the plurality of assembly electrodes 210c. When power of different polarity is applied to the pair of assembly electrodes 210c at the lower side of each cell 210d by a power supply unit (not shown), an electric field is formed, and the semiconductor light emitting device 150 can be accommodated and assembled into the cells 210d by the electric field.

<Roller Part: Roller Rotating Part, Roller Driving Part, Magnet Head Part>

The intelligent assembly-transfer integration device 1000 according to the embodiment can include a roller part 200 that rotates the assembly substrate 210. The roller part 200 can include a roller rotating part 220, a roller driving part 230, and a magnet head part 400.

For example, the roller part 200 can include a roller rotating part 220 on which the assembly substrate 210 is mounted and rotated, a roller driving part 230 for driving the roller rotating part 220 to rotate and a magnet head part 400 that applies magnetic force to the semiconductor light emitting device 150 to assemble it to the assembly substrate 210.

When the semiconductor light emitting devices 150 assembled on the assembly substrate 210 are transferred to the panel substrate 910, the roller part 200, the assembly substrate 210 and the panel substrate 910 can meet on one line or a plurality of lines so that the semiconductor light emitting devices 150 can be transferred.

The roller driving part 230 can rotate and drive the roller rotating part 220 on which the assembly substrate 210 is mounted using the roller driving part 230, and the roller driving part 230 can include a single or multiple motors, but is not limited thereto.

The roller rotating part 220 can be formed of a flexible material so that the mounted assembly substrate 210 rotates efficiently. In addition, the roller rotating part 220 can be in the form of a belt, but is not limited thereto. The roller rotating part 220 can have a thickness of 5 mm or less so that the magnetic force of the magnet head part 400 can be well transmitted to the semiconductor light emitting device 150 in a state where the assembly substrate 210 is mounted, but is not limited thereto.

The roller part 200 can include a magnet head part 400 that applies magnetic force so that the semiconductor light emitting device 150 is attached to the assembly substrate 210.

FIG. 5A is a perspective view of the magnet head part 400 in the intelligent assembly-transfer integration device 1000 according to the embodiment shown in FIG. 3. And FIG. 5B is a 180° inverted perspective view of the magnet head 400 shown in FIG. 5A.

The magnet head part 400 is located inside the roller part 200 and can function to guide the semiconductor light emitting device 150 in the fluid chamber 300 toward the assembly electrode 210c of the assembly substrate 210. The magnet head part 400 can be one or plural.

Referring to FIG. 5A, the magnet head 400 of the embodiment can include a plurality of magnets 410. The magnet 410 can be spaced apart from the fluid chamber 300 to apply magnetic force to the semiconductor light emitting device 150, and the position can be controlled by a position controller (not shown) connected to the magnet 410. The magnet 410 can be a permanent magnet or an electromagnet.

The embodiment includes a magnet handler (not shown) capable of automatically or manually moving the magnet head part 400, or a motor (not shown) capable of rotating the magnet head part 400, so that the magnet head 400 can be rotationally driven (Z) in a clockwise or counterclockwise direction, and the magnet head 400 can be horizontally driven (X-Y) in a direction perpendicular to the rotational direction of the assembly substrate 210.

In the embodiment, the magnet head 400 rotates to evenly distribute the magnetic force applied to the semiconductor light emitting device 150, thereby improving assembly speed.

In addition, as the magnet head part 400 rotates while moving a certain section in a direction perpendicular to the rotational direction of the assembly substrate 210, the magnetic force is more evenly distributed, so that the assembly speed of the semiconductor light emitting device 150 can be increased and the semiconductor light emitting device 150 can be evenly assembled on the assembly substrate 210.

<Cleaning Unit, Drying Unit, Assembly Inspection Part, Panel Driving Part, Panel Chuck>

Referring back to FIG. 3, the intelligent assembly-transfer integration device 1000 according to the embodiment can include a cleaning unit 700, a drying unit 800, and an assembly inspection part 500.

The cleaning unit 700 sprays a solution on an area other than the assembly area of the assembly substrate 210 to remove the semiconductor light emitting device 150 attached outside the assembly area of the assembly substrate 210, and can spray to cover the entire line at once.

The drying unit 800 can apply hot air or heat to the semiconductor light emitting device 150 so that the assembly solution is evaporated before being transferred.

The assembly inspection part 500 can inspect whether the semiconductor light emitting device 150 is assembled to the assembly substrate 210 or whether it is correctly assembled.

The assembly inspection part 500 can perform a line scan assembly inspection, and can cover the entire line at once. The assembly inspection part 500 can include a CCD image sensor, transmit inspection results to a control unit (not shown), and determine whether or not to transfer to the panel substrate 910 according to the inspection results.

FIG. 6 is an exemplary operation diagram of an intelligent assembly-transfer integration device 1000 according to an embodiment.

The intelligent assembly-transfer integration device 1000 according to the embodiment can include a panel driving part 920 for horizontally moving the display panel substrate 910 and a panel chuck (not shown) for vertically moving the panel substrate 910.

The panel driving part 920 can be provided singly or in plural, and is shown as two in FIG. 6, but is not limited thereto. The panel driver 920 can be driven by a motor, but is not limited thereto.

The panel chuck can be disposed on a side surface, top surface, or bottom surface of the panel substrate 910 to separate the panel substrate 910 from the assembly substrate 210.

According to the embodiment, the assembly state of each line is inspected in the width direction of the assembly substrate 210, and line position information such as non-assembled or defective assembly is transmitted to the system control unit (not shown), and the transfer process is not performed on the panel substrate 910.

For example, by inspecting the assembly state of each line in the width direction of the assembly substrate 210 and moving the panel substrate 910 upward through the panel chuck when there is an error position E such as non-assembly or defective assembly, there is a special technical effect of separating the assembly substrate 210 and the panel substrate 910 and controlling the semiconductor light emitting device 150 on the error position line from being transferred to the panel substrate 910.

According to the embodiment, when the semiconductor light emitting device 150 among the pixels for each line is not assembled or is not properly assembled on the assembly substrate 210, the embodiment has a special technical effect of simultaneously increasing the transfer speed and transfer yield by preventing the semiconductor light emitting device 150 on the corresponding line from being transferred to the panel substrate 910.

FIG. 7 is a conceptual view of tilting the panel substrate 910 in an embodiment.

In the embodiment, the panel chuck can have a fine rotation function of the panel substrate 910 so that the semiconductor light emitting device 150 can be better transferred from the assembly substrate 210 to the panel substrate 910.

Referring to (A) of FIG. 7, in the embodiment, the panel driver 920 can include a first-first panel driver 920$a$1 and a first-second panel driver 920$a$2. The heights of the first-first panel driver 920$a$1 and the first-second panel driver 920$a$2 can be the same. Accordingly, the transfer of the semiconductor light emitting device 150 can proceed while the panel substrate 910 is moved while being kept horizontal.

Meanwhile, referring to (B) of FIG. 7, in the embodiment, the second panel driver 920B includes a second-first panel driver 920$b$1 and a second-second panel driver 920$b$2, but the second-first panel driver 920$b$1 can be disposed at a different height from the second-second panel driver 920$b$2.

For example, the second-first panel driver 920$b$1 can be disposed lower than the second-second panel driver 920$b$2. Accordingly, the front end 912$b$1 of the second panel substrate 912 can be disposed lower than the rear end 912$b$2. As the second panel substrate 912 is moved in an inclined state, the semiconductor light emitting device 150 can be transferred. Accordingly, transfer of the semiconductor light emitting device 150 from the assembly substrate 210 to the second panel substrate 912 can be more effectively performed.

According to the electrode structure of the transfer roller part of the semiconductor light emitting device according to the embodiment and the intelligent assembly and transfer integration device including the same, in transferring semiconductor light emitting devices to a display panel, there is a technical effect of simultaneously improving transfer speed and transfer yield.

Specifically, according to the embodiment, a line can be transferred in the width direction of the roller part 200 at a portion where the assembly substrate 210 on the roller part 200 and the flat panel substrate 910 meet. In addition, according to the embodiment, since only the semiconductor light emitting devices on the fully assembled line without defects selected through assembly inspection are transferred, a 100% transfer yield can be implemented.

Accordingly, according to the embodiment, even if there is a defect in the assembly substrate or the defect in the semiconductor light emitting device, it is possible to avoid and transfer the defect, thereby minimizing the dependence on the quality of the semiconductor light emitting device.

In addition, according to the embodiment, since the assembly process and the transfer process are separated but connected in-line, there is an effect of not limiting the transfer area according to the size of the assembly system.

In addition, according to the embodiment, since a separate space for assembly is not required at the edge portion of the panel substrate, a high chamfering rate can be secured when chamfering a small area after a large area process.

In addition, according to the embodiment, if the roller part is configured in multiples, there is an effect of realizing high-speed transfer.

<Assembly, Inspection, Transfer Process>

Hereinafter, assembly, inspection, and transfer processes using the intelligent assembly-transfer integration device 1000 of a semiconductor light emitting device according to FIGS. 3 and 6 will be described.

First, the semiconductor light emitting device 150 is put into the fluid chamber 300, and the assembly substrate 210 is mounted on the roller part 200.

Next, magnetic force is applied to the semiconductor light emitting device 150 using the magnet head 400 so that the semiconductor light emitting device 150 rises vertically in the fluid chamber 300.

When the magnet head 400 is an electromagnet, the separation distance between the assembly surface of the assembly substrate 210 and the semiconductor light emitting device 150 can be controlled by adjusting the magnitude of the magnetic force. For example, the separation distance can be controlled using the weight, buoyancy, and magnetic force of the semiconductor light emitting device 150.

Next, magnetic force is applied to the semiconductor light emitting device 150 so that the semiconductor light emitting device 150 moves in one direction within the fluid chamber 300. For example, while moving the magnet of the magnet head part 400 in a direction perpendicular to the rotation direction of the assembly substrate 210, it can be rotated clockwise or counterclockwise.

Next, in the process of moving the semiconductor light emitting device 150, an electric field is applied to the semiconductor light emitting device 150 so that the semiconductor light emitting device 150 is seated at the assembly position of the assembly substrate 210, and a step of guiding the semiconductor light emitting device 150 to the assembly position is performed. For example, by an electric field while the semiconductor light emitting device 150 moves along the assembly substrate 210, it can move in a vertical or horizontal direction with the assembly substrate 210 and be seated at an assembly position of the assembly substrate 210.

For example, it is possible to generate an electric field by supplying power to the bi-planar electrodes of the assembly substrate 210, and use this to control the assembly to be assembled only at the assembly position. That is, by using the selectively generated electric field, the semiconductor light emitting device 150 is self-assembled to the assembly position of the assembly substrate 210.

Next, the cleaning unit 700 sprays the solution to an area other than the assembly area, so that the semiconductor light emitting device 150 attached to the outside of the assembly area of the assembly substrate 210 can be removed, and the solution can be sprayed so as to cover the entire line at once.

Next, the drying unit 800 can apply hot air or heat to the assembled semiconductor light emitting device 150 so that the assembly solution is evaporated before transfer.

Next, the assembly inspection part 500 can inspect whether or not the semiconductor light emitting device 150 is assembled to the assembly substrate 210 and whether or not the assembly is defective. The assembly inspection part 500 can perform a line scan assembly inspection, and can cover the entire line at once. The assembly inspection part 500 can include a CCD image sensor, transmit inspection results to a control unit, and determine whether or not to transfer to the panel substrate 910 according to the inspection results.

Next, referring to FIG. 6, according to the intelligent assembly-transfer integration device 1000 according to the embodiment, the assembly state of each line is inspected in the width direction of the assembly substrate 210, and line position information in case of non-assembly or defective assembly is transmitted to the system control unit so that the transfer process does not proceed on the panel substrate 910.

For example, by inspecting the assembly state of each line in the width direction of the assembly substrate 210 and moving the panel substrate 910 upward through the panel chuck when there is an error position E such as non-assembly or defective assembly, there is a special technical effect that can be controlled so that the transfer process does not proceed on the panel substrate 910 by being separated from the assembly substrate 210.

According to the embodiment, when the semiconductor light emitting device 150 is not assembled or is not properly assembled among the pixels for each line on the assembly substrate 210, there is a special technical effect of simultaneously increasing the transfer speed and transfer yield by preventing the semiconductor light emitting device 150 on the corresponding line from being transferred to the panel substrate 910.

Referring again to FIG. 3, a post-process for implementing a display device can be performed on the semiconductor light emitting device 150 transferred to the panel substrate 910.

Next, FIG. 8 is a conceptual diagram of an intelligent assembly-transfer integration device 1000 according to an embodiment.

Referring to FIG. 8, in the embodiment, the assembly substrate 210 is mounted on the roller rotating part 220, and the semiconductor light emitting device 150 is put into the fluid chamber 300.

Then, magnetic force is applied to the semiconductor light emitting device 150 in the fluid chamber 300 using the magnet head 400. Next, in the process of moving the semiconductor light emitting device 150, an electric field is applied to the semiconductor light emitting device 150 so that the semiconductor light emitting device 150 is seated at the assembly position of the assembly substrate 210, and a step of guiding the semiconductor light emitting device 150 to the assembly position is performed.

The assembly substrate 210 can include an active region where the semiconductor light emitting device 150 is assembled and a pad region (not shown) for applying power to the assembly substrate 210.

Meanwhile, in the embodiment, the fluid chamber 300 can include a water tank frame 310 to prevent fluid from leaking out. In addition, according to the embodiment, an O-ring 320 is disposed between the water tank frame 310 and the assembly substrate 210 to prevent fluid from leaking out. When the fluid leaks out of the water tank frame 310, the fluid contacts a pad region (not shown) of the assembly substrate 210 other than the active region where the semiconductor light emitting device is assembled, causing electrical and structural damage to the pad region.

As described above, in the intelligent assembly-transfer integration device 1000 in the non-public internal technology, the assembly substrate 210 mounted on the roller rotating part 220 for self-assembly comes into contact with the O-ring 320 of the bath, there is a problem that electrodes in the pad area on the assembly substrate 210 are damaged due to mutual frictional force.

Accordingly, one of the technical challenges of the embodiment is to provide an electrode structure of a transfer roller part of a semiconductor light emitting device capable of preventing damage to electrodes of an assembly substrate and an intelligent assembly-transfer integration device including the same.

FIG. 9 is an enlarged view of the first roller electrode structure C1 developed to solve the above technical problem in the intelligent assembly-transfer integration device 1000 according to the embodiment shown in FIG. 8.

In the embodiment, the first roller part electrode structure (C1) can include the roller rotating part 220, the adhesive film 215, the assembly substrate 210, the penetration electrode 217a penetrating the assembly substrate 210, and the roller pad electrode 217b.

The assembly substrate 210 can include a base portion 210a, a dielectric layer 210b, a plurality of assembly electrodes 210c, an assembly pad electrode 210c2, and a barrier wall 210e.

The base portion 210a is made of an insulating material, and the plurality of assembly electrodes 210c can be thin film or thick film bi-planar electrodes patterned on one surface of the base portion 210a. The dielectric layer 210b is made of an inorganic material such as $SiO_2$, $SiN_x$, $SiON$, $Al_2O_3$, $TiO_2$, or $HfO_2$. In addition, the assembly substrate 210 can include a plurality of cells partitioned by partition walls 210e. The barrier wall 210e can protrude upward from the base portion 210a.

After the assembly substrate 210 is manufactured on a predetermined glass substrate (not shown), the glass substrate can be removed by an LLO process or the like, but is not limited thereto.

The assembly substrate 210 can be mounted on the roller rotating part 220 by an adhesive film 215.

The adhesive film 215 may include a first adhesive layer 215a, an intermediate layer 215b, and a second adhesive layer 215c. The second adhesive layer 215c may be a layer in contact with the assembly substrate 210, and the first adhesive layer 215a may be a layer in contact with the roller rotating part 220. The first and second adhesive layers 215a and 215c may include at least one of UV film, PC (Polycarbonate), acrylic (PMMA, PolyMethyl MethAcrylate), polyethylene terephthalate, polyethylene, polypropylene, or polyester, but are not limited thereto. The intermediate layer 215b may be formed of an insulating material and may function as a base film.

On the other hand, in the embodiment, the first roller part electrode structure C1 can include a penetration electrode 217a penetrating the assembly substrate 210 and a roller pad electrode 217b disposed on the roller rotating part 220.

In the embodiment, electrodes in the electrode structure C1 of the roller part may not come into contact with the O-ring 320 due to the above electric structure. Accordingly, according to the embodiment, there is a technical effect of preventing electrode damage due to friction by having a rear electrode structure in which the electrode part directly in contact with the O-ring is moved to the rear surface during self-assembly.

The penetration electrode 217a can be formed before the assembly substrate 210 is mounted on the roller rotating part 220. For example, after the adhesive film 215 is adhered to the assembly substrate 210, a through hole (not shown) can be formed in the adhesive film 215, and then it can be formed by solder paste or the like, but is not limited thereto.

The roller pad electrode 217b can include a first pad electrode 217b1, a second pad electrode 217b2, and a third pad electrode 217b3.

The first pad electrode 217b1 can be formed on the assembly substrate 210 or on the roller rotating part 220, but is not limited thereto.

The second pad electrode 217b2 can be disposed on a side surface of the roller rotating part 220, and the third pad electrode 217b3 can be disposed on the rear surface of the roller rotating part 220, but is not limited thereto.

In the embodiment, as power is applied to the third pad electrode 217b3, self-assembly by an electric field can proceed.

According to the embodiment, a release film 322 is formed on the assembly substrate 210 to reduce frictional force with the O-ring 320.

Next, FIG. 10 is an enlarged view of the second roller part electrode structure C2 in the intelligent assembly-transfer integration device 1000 according to the embodiment shown in FIG. 8.

The second roller electrode structure C2 can adopt the technical characteristics of the first roller electrode structure C1.

For example, the second roller part electrode structure C2 can include a second penetration electrode 217a2 penetrating the assembly substrate 210 and a roller pad electrode 217b disposed on the roller rotating part 220.

Hereinafter, the main technical characteristics of the second roller electrode structure C2 will be mainly described.

The roller pad electrode 217b can include a first pad electrode 217b1, a second pad electrode 217b2, a third pad electrode 217b3, and a fourth pad electrode 217b4.

The second pad electrode 217b2 can be disposed on the side of the roller rotating part 220, and the fourth pad electrode 217b4 can be disposed on the side of the adhesive film 215.

The second pad electrode 217b2 and the fourth pad electrode 217b4 can be formed individually or integrally.

For example, the fourth pad electrode 217b4 can be formed on the side of the adhesive film 215 to be electrically connected to the first pad electrode 217b1. The second pad electrode 217b2 can be formed on a side surface of the roller rotating part 220 to be electrically connected to the third pad electrode 217b3.

Alternatively, the first pad electrode 217b1 can be formed on the assembly substrate 210. In addition, a third pad electrode 217b3 can be formed on the roller rotating part 220. Thereafter, the assembly substrate 210 equipped with the first pad electrode 217b1 can be mounted on the roller rotating part 220 equipped with the third pad electrode 217b3 using the adhesive film 215.

After that, the second pad electrode 217b2 and the fourth pad electrode 217b4 are integrally formed at once, so that the first pad electrode 217b1 and the third pad electrode 217b3 can be electrically connected.

According to the embodiment, the second penetration electrode 217a2 can be formed to penetrate the base portion 210a of the assembly substrate 210 without penetrating the adhesive film 215.

According to the electrode structure of the transfer roller part of the semiconductor light emitting device according to the embodiment and the intelligent assembly-transfer integration device including the same, there is a technical effect capable of preventing damage to the electrodes of the assembly substrate.

For example, according to the embodiment, there is a technical effect of preventing electrode damage due to friction due to the rear electrode structure in which the electrode part directly in contact with the O-ring is moved to the rear surface during self-assembly.

Next, FIG. 11 is a conceptual diagram of an intelligent assembly-transfer integration device 1002 according to the second embodiment. FIG. 12 is an enlarged view of the electrode structure C3 of the third roller part in the intelligent assembly-transfer integration device 1002 according to the second embodiment shown in FIG. 11.

The intelligent assembly-transfer integration device 1002 according to the second embodiment can adopt the technical features of the intelligent assembly-transfer integration device 1000 according to the first embodiment. Hereinafter, the technical features of the second embodiment will be mainly described.

The intelligent assembly-transfer integration device 1002 according to the second embodiment has a special technical effect in that the O-ring itself can be omitted, unlike the first embodiment.

The third roller electrode structure C3 in the second embodiment can adopt the technical characteristics of the first roller electrode structure C1 in the first embodiment.

Hereinafter, with reference to FIG. 12, the technical characteristics of the third roller electrode structure C3 will be mainly described.

Referring to FIG. 12, in the second embodiment, the third roller part electrode structure C3 can include the roller rotating part 220, the adhesive film 215, the assembly substrate 210, the penetration electrode 217a penetrating the assembly substrate 210, and the roller pad electrode 217b.

The assembly substrate 210 can include a base portion 210a, a second dielectric layer 210b2, a plurality of assembly electrodes 210c, an assembly pad electrode 210c2, and a barrier wall 210e. The second dielectric layer 210b2 is made of an inorganic material such as $SiO_2$, $SiN_x$, $SiON$, $Al_2O_3$, $TiO_2$, or $HfO_2$. In addition, the second dielectric layer 210b2 is an organic insulator and can be formed as a single layer or a multi-layer structure.

In this case, in the second embodiment, the second dielectric layer 210b2 can be disposed to cover not only the plurality of assembly electrodes 210c but in addition the assembly pad electrode 210c2.

The assembly substrate 210 can be mounted on the roller rotating part 220 by an adhesive film 215.

The roller pad electrode 217b can include a first pad electrode 217b1, a second pad electrode 217b2, and a third pad electrode 217b3.

The first pad electrode 217b1 can be formed on the assembly substrate 210 or on the roller rotating part 220, but is not limited thereto.

According to the second embodiment, the second dielectric layer 210b2 is formed to cover not only the plurality of assembly electrodes 210c but also the assembly pad electrode 210c2, there is no need to use an O-ring itself, and the overall size of the water tank and rotating part can be reduced, which has a special technical effect of increasing the degree of freedom of space.

Next, FIG. 13 is an enlarged view of the fourth roller part electrode structure C4 in the intelligent assembly-transfer integration device 1002 according to the second embodiment shown in FIG. 11.

The fourth roller electrode structure (C4) can adopt the technical characteristics of the third roller electrode structure (C3). Hereinafter, the technical characteristics of the fourth roller part electrode structure (C4) will be mainly described.

Referring to FIG. 13, the fourth roller electrode structure (C4) in the second embodiment can include the roller rotating part 220, the adhesive film 215, the assembly substrate 210, the penetration electrode 217a penetrating the assembly substrate 210, and the second roller pad electrode 218b.

The second dielectric layer 210b2 can be formed to cover not only the plurality of assembly electrodes 210c but in addition the assembly pad electrode 210c2.

In addition, the second roller pad electrode 218b can include the second-first pad electrode 218b1, the second-second pad electrode 218b2 and the 2-3 pad electrode 218b3 disposed on the roller rotating part 220.

At this time, the second-second pad electrode 218b2 can be a pad electrode penetrating the roller rotating part 220.

According to the second embodiment, since the second roller pad electrode 218b is not disposed on the side surface of the roller rotating part 220, electrical reliability is dramatically improved as the risk of electrical damage from the fluid is prevented, and the overall size of the water tank and the rotator can be reduced, thereby increasing spatial freedom.

According to the intelligent assembly-transfer integrating device of the semiconductor light emitting device according to the embodiment, there is a technical effect of simultaneously improving the transfer speed and the transfer yield in transferring the semiconductor light emitting devices to the display panel.

For example, according to the embodiment, as the semiconductor light emitting device 150 is assembled to a transfer substrate 210, and the assembled semiconductor light emitting devices 150 are immediately transferred to the panel substrate 110 in line, the transfer speed can be significantly improved. In addition, according to the embodiment, only when the semiconductor light emitting devices 150 assembled on the transfer substrate 210 are inspected in real time and are normal, by selectively transferring the semiconductor light emitting devices 150 to the panel substrate 910, the transfer yield can be remarkably increased. Accordingly, according to the embodiment, by simultaneously increasing the transfer speed and the transfer yield, there is a special technical effect that can solve the problem of technical contradiction between the transfer speed and the transfer yield.

Specifically, according to the embodiment, a line can be transferred in the width direction of the roller part 200 at a portion where the assembly substrate 210 on the roller part 200 and the flat panel substrate 910 meet. In addition, according to the embodiment, since only the semiconductor light emitting devices on the completely assembled line without defects selected through assembly inspection are transferred, 100% transfer yield can be implemented.

Accordingly, according to the embodiment, even if there is a defect in the assembly substrate or the defect in the semiconductor light emitting device, it is possible to avoid and transfer the defect, thereby minimizing the dependence on the quality of the semiconductor light emitting device.

In addition, according to the embodiment, since the assembly process and the transfer process are separated but connected in-line, there is an effect of not limiting the transfer area according to the size of the assembly system.

In addition, according to the embodiment, since a separate space for assembly is not required at the edge portion of the panel substrate, a high chamfering rate can be secured when chamfering a small area after a large area process.

In addition, according to the embodiment, if the roller part is configured in multiples, there is an effect of realizing high-speed transfer.

In addition, according to the electrode structure of the transfer roller part of the semiconductor light emitting device and the intelligent assembly-transfer integrating device including the electrode structure according to the embodiment, there is a technical effect capable of preventing damage to the electrodes of the assembly substrate.

For example, according to the embodiment, there is a technical effect of preventing electrode damage due to friction due to the rear electrode structure in which the electrode part directly in contact with the O-ring is moved to the rear surface during self-assembly. In addition, according to the embodiment, it is not necessary to use the O-ring itself when applying the rear electrode, and the overall size of the water tank and the rotating part can be reduced, so that the degree of freedom of space increases.

In addition, according to the embodiment, since the second roller pad electrode is not disposed on the side surface of the roller rotating part, the possibility of receiving electrical damage from the fluid is prevented, electrical reliability is remarkably improved, and the overall size of the water tank and the rotating part can be reduced, which has the effect of increasing the degree of freedom of space.

The above description is only an example of the technical idea of the embodiment, and various modifications and variations can be made to those skilled in the art without departing from the essential characteristics of the embodiment.

Therefore, the embodiments disclosed in the examples are not intended to limit the technical idea of the embodiment but to explain, and the scope of the technical idea of the embodiment is not limited by these examples.

The protection scope of the embodiment should be interpreted according to the claims below, and all technical ideas within the scope equivalent thereto should be construed as being included in the scope of rights of the embodiment.

INDUSTRIAL APPLICABILITY

The electrode structure of the transfer roller part of the semiconductor light emitting device according to the embodiment and the intelligent assembly-transfer integrating device including the electrode structure can be used in manufacturing a display device.

The invention claimed is:

1. An electrode structure of a transfer roller part of a semiconductor light emitting device comprising:
   a roller rotating part;
   an assembly substrate mounted on the roller rotating part;
   an adhesive film disposed between the roller rotating part and the assembly substrate;
   a penetration electrode penetrating the assembly substrate; and
   a roller pad electrode disposed on the roller rotating part and electrically connected to the penetration electrode.

2. The electrode structure of the transfer roller part of the semiconductor light emitting device according to claim 1, wherein the assembly substrate comprises a base, a plurality of assembly electrodes and assembly pad electrodes disposed on the base, and a dielectric layer on the base, and
   wherein the penetration electrode penetrates the base and the adhesive film and is electrically connected to the assembly pad electrodes.

3. The electrode structure of the transfer roller part of the semiconductor light emitting device according to claim 2, wherein the roller pad electrode comprises a first pad electrode disposed on a first surface of the roller rotating part, a second pad electrode disposed on a side surface of the roller rotating part, and a third pad electrode disposed on a second surface of the roller rotating part.

4. The electrode structure of the transfer roller part of the semiconductor light emitting device according to claim 1, wherein the roller pad electrode comprises a first pad electrode disposed on a first surface of the roller rotating part, a second pad electrode disposed on a side surface of the roller rotating prat, and a third pad electrode disposed on a second surface of the roller rotating part.

5. The electrode structure of the transfer roller part of the semiconductor light emitting device according to claim 1, wherein the assembly substrate comprises a base, a plurality of assembly electrodes and assembly pad electrodes disposed on the base, and a dielectric layer on the base, and
   wherein the dielectric layer is disposed to cover the plurality of assembly electrodes.

6. The electrode structure of the transfer roller part of the semiconductor light emitting device according to claim 5, wherein the dielectric layer is disposed to cover the plurality of assembly electrodes and the assembly pad electrodes.

7. The electrode structure of the transfer roller part of the semiconductor light emitting device according to claim 4, wherein the roller pad electrode comprises a second-first pad electrode disposed on a first surface of the roller rotating part; a second-third pad electrode disposed on a second surface of the roller rotating part, and a second-second pad electrode disposed between the second-first pad electrode and the second-third pad electrode.

8. The electrode structure of the transfer roller part of the semiconductor light emitting device according to claim 7, wherein the second-second pad electrode is configured to pass through the roller rotating part.

9. An intelligent assembly-transfer integration device comprising:
   a fluid chamber accommodating semiconductor light emitting devices;
   an assembly substrate on which the semiconductor light emitting devices are assembled;
   a roller part on which the assembly substrate is mounted and rotated; and
   an assembly inspection part for inspecting the semiconductor light emitting devices assembled on the assembly substrate,
   wherein the roller part comprises an electrode structure of a transfer roller part of a semiconductor light emitting device according to claim 1.

* * * * *